United States Patent
Werner et al.

(10) Patent No.: US 10,512,169 B2
(45) Date of Patent: Dec. 17, 2019

(54) GLAZING EQUIPPED WITH AN ELECTRICALLY CONDUCTIVE DEVICE POSSESSING AN IMPROVED RESISTANCE TO TEMPERATURE CYCLING TESTS

(71) Applicant: SAINT-GOBAIN GLASS FRANCE, Courbevoie (FR)

(72) Inventors: Katja Werner, Simmerath (DE); Bernhard Reul, Herzogenrath (DE); Klaus Schmalbuch, Aachen (DE); Camille Dassonville, Compiegne (FR); Clément Briquet, Elincourt Sainte Marguerite (FR); Juliette Jamart, Compiegne (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 16/060,725

(22) PCT Filed: Dec. 8, 2016

(86) PCT No.: PCT/FR2016/053274
§ 371 (c)(1),
(2) Date: Jun. 8, 2018

(87) PCT Pub. No.: WO2017/098164
PCT Pub. Date: Jun. 15, 2017

(65) Prior Publication Data
US 2018/0368268 A1   Dec. 20, 2018

(30) Foreign Application Priority Data

Dec. 10, 2015  (FR) ..................................... 15 62116

(51) Int. Cl.
*H05K 3/34* (2006.01)
*C03C 17/06* (2006.01)
(Continued)

(52) U.S. Cl.
CPC ........... *H05K 3/3457* (2013.01); *B23K 13/01* (2013.01); *B23K 35/262* (2013.01); *C03C 17/04* (2013.01);
(Continued)

(58) Field of Classification Search
CPC ........ H05K 3/3457; H05K 1/09; B23K 13/01; B23K 35/262; C03C 17/04; C03C 17/06
(Continued)

(56) References Cited

U.S. PATENT DOCUMENTS

| 2004/0104262 A1 | 6/2004 | Mears | |
| 2011/0186340 A1* | 8/2011 | Kuramoto | H01B 1/22 174/260 |

(Continued)

OTHER PUBLICATIONS

International Search Report as issued in International Patent Application No. PCT/FR2016/053274, dated Mar. 27, 2017.

*Primary Examiner* — Tremesha S Willis
(74) *Attorney, Agent, or Firm* — Pillsbury Winthrop Shaw Pittman LLP

(57) ABSTRACT

A glazing includes at least one substrate, one portion of which includes an electrically conductive element, the conductive element including a connector made of chromium-containing steel, which connector is soldered with a solder based on tin, silver and copper to an electrically conductive track, wherein the electrically conductive track, which is formed by fritting a silver paste including a mixture of silver powder and glass frit, has a resistivity measured at 25° C. lower than or equal to 3.5 µΩ·cm and a porosity level lower than 20%, the porosity level being measured by scanning electron microscopy from a cross section through the portion of the substrate including the electrically conductive track and having been polished beforehand by ion milling.

20 Claims, 2 Drawing Sheets

(51) Int. Cl.

| | | |
|---|---|---|
| *C03C 17/36* | (2006.01) | |
| *B23K 35/26* | (2006.01) | |
| *C03C 17/04* | (2006.01) | |
| *C03C 17/10* | (2006.01) | |
| *C22C 13/00* | (2006.01) | |
| *H05K 1/09* | (2006.01) | |
| *H05K 1/18* | (2006.01) | |
| *H05K 3/26* | (2006.01) | |
| *B23K 13/01* | (2006.01) | |
| *B60R 16/02* | (2006.01) | |
| *H01Q 1/32* | (2006.01) | |
| *B23K 101/38* | (2006.01) | |

(52) U.S. Cl.
CPC .............. *C03C 17/06* (2013.01); *C03C 17/10* (2013.01); *C03C 17/36* (2013.01); *C22C 13/00* (2013.01); *H05K 1/09* (2013.01); *H05K 1/181* (2013.01); *H05K 3/26* (2013.01); *B23K 2101/38* (2018.08); *B60R 16/02* (2013.01); *C03C 2217/256* (2013.01); *C03C 2217/42* (2013.01); *C03C 2217/425* (2013.01); *H01Q 1/32* (2013.01); *H05K 2201/10189* (2013.01)

(58) Field of Classification Search
USPC ......................................................... 174/257
See application file for complete search history.

(56) References Cited

U.S. PATENT DOCUMENTS

| | | | |
|---|---|---|---|
| 2014/0110166 A1* | 4/2014 | Degen | H05B 3/84 174/84 R |
| 2015/0162677 A1 | 6/2015 | Schmalbuch et al. | |

* cited by examiner

GLAZING EQUIPPED WITH AN ELECTRICALLY CONDUCTIVE DEVICE POSSESSING AN IMPROVED RESISTANCE TO TEMPERATURE CYCLING TESTS

CROSS-REFERENCE TO RELATED APPLICATIONS

This application is the U.S. National Stage of PCT/FR2016/053274, filed Dec. 8, 2016, which in turn claims priority to French patent application number 1562116 filed Dec. 10, 2015. The content of these applications are incorporated herein by reference in their entireties.

FIELD

The present invention relates to a glazing comprising an electrically connecting element, its manufacturing process and its use in the field of automotive glazings.

The invention more particularly relates to an automotive glazing having an electrical function, such as for example heated or de-icing glazings or even glazings equipped with antennae.

BACKGROUND

Heating wires, antennae or other sensors present in automotive glazings are electrically conductive tracks formed from a conductive paste, such as for example a silver-containing paste, screen-printed onto a glass substrate, and are connected to an electrical power supply by way of connectors soldered to the conductive paste. For reasons of differences in the thermal expansion coefficients of the materials used in these systems, strains or mechanical stresses appear during the manufacture and handling of these glazings, generating weakness and causing cracks to appear therein, especially in the region of these connectors. The solder alloys used up to now were generally based on lead and therefore on a metal of high ductility. This ensured that when the resistance tests specified by manufacturers were performed no cracks appeared that were such as to make the glazing unsuitable for the desired use. A European directive currently forbids the use of this type of lead-based alloy and much work has been carried out with a view to finding other solder alloys capable of replacing lead-based alloys. A good compromise is obtained with alloys containing tin, silver and copper. These alloys not only possess properties that make them good solders but also have the robustness required to pass the tests currently specified by automotive manufacturers. In parallel to this underlying problem related to the removal of lead from solder alloys, the ageing tests carried out on connectors have become stricter; in particular, the conditions of temperature cycling tests have become stricter. These temperature cycling tests are also referred to by their acronym TCT "Temperature Cycling Test". The objective of these tests is to determine whether the glazing is able to withstand successive rapid increases and decreases in temperature, without being weakened. These tests were developed to accelerate the appearance of effects caused by differences in the thermal behaviour of the various components of a system. The new test specifies that temperature be varied between −40° C. and +105° C., which is a larger range of variation than used in preceding tests, which were limited to 90° C. The number of cycles has also been changed since it has passed from 10 cycles to a minimum of 60 cycles. The new TCT conditions also require that a voltage of 14 V be applied during these temperature variations in the phases in which temperature is increased, thereby generating additional heat corresponding to local temperatures that may be as high as approximately 120° C. Despite optimization of connector shape and material, known and currently used systems are not resistant enough and cracks or fissures may appear following these stricter tests. Specifically, the greater stiffness of alloys based on tin, silver and copper in comparison to lead-based alloys leads to heightened transfer of stresses to the substrate. The physical properties of these alloys in combination with the stricter TCT tests lead to more defects or cracks being generated in the glazings. The higher temperatures reached also lead to greater thermal expansion of the connector and of the solder alloy, thereby placing more stress on the electrically connecting element in its entirety. Glazings equipped with this type of connector and alloy therefore do not meet the criteria specified by these tests and thus do not comply with the criteria specified by manufacturers.

SUMMARY

The present invention relates to a glazing consisting of a substrate comprising an electrically connecting system deposited on the substrate, which is composed of at least one electrical connector, a conductive metal paste and a solder alloy, said system exhibiting a better robustness in temperature behaviour tests since it allows the number of cracks liable to be able to appear in the substrate after tests applying increases and decreases in temperature to be significantly decreased.

One object of the present invention is a glazing consisting of a substrate at least one portion of which comprises an electrically conductive element, said conductive element comprising a connector made of chromium-containing steel, which connector is soldered with a solder based on tin, silver and copper to an electrically conductive track, wherein the electrically conductive track, which is silver-based, has a resistivity measured at 25° C. lower than or equal to 3.5 µΩ·cm and a porosity level lower than 20%, said porosity level being measured by scanning electron microscopy from a cross section through the portion of the substrate comprising the electrically conductive track and having been polished beforehand by ion milling. The glazing according to the invention is a glazing that resists to the TCT imposing 60 successive cycles during which temperature changes between −40° C. and +105° C., under a voltage of 14V during phases in which temperature is increased.

DETAILED DESCRIPTION

Figure 1:
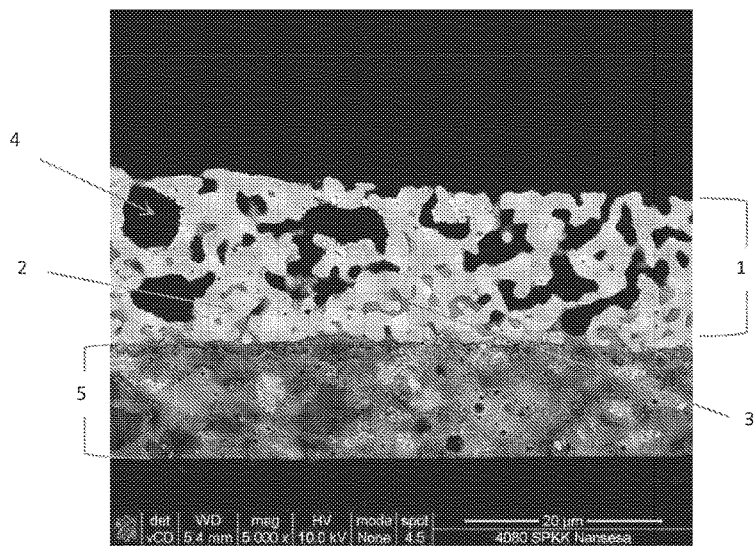
FIG. 1 is an image observed by scanning electron microscopy of a sample not according to the invention, in which the electrically conductive layer (1) is observed to have a high porosity level (higher than 20%).

The inventors have shown that, surprisingly, by choosing a particular material for the connector, a specific type of solder alloy and a silver-containing conductive paste having both a low porosity level and a low specific resistance, it is possible to obtain an electrically connecting system for an automotive glazing that is able to withstand the new TCT conditions.

When talking about firing of the electrically conductive paste, one talks about heat treatment under air at a temperature comprised between 550° C. and 700° C. during a period varying from 2 to 10 minutes, that makes possible to fix the silver electrically conductive paste on the substrate. The measurements for characterizing the electrically conductive paste are made after its firing.

The silver-based electrically conductive track is a fritted silver paste comprising a mixture of silver powder and glass frit. Advantageously, the silver paste comprises some particles with different sizes, among which small particles with a size less than 500 nm are present. The size and the form of the silver particles are measured on images of the cross section of the substrate coated with the silver electrically conductive track, after firing and ion milling, and obtained from scanning electric microscope.

Advantageously, the granulometry of the silver particles present in the electrically conductive paste is such that the average diameter D10 is less than 1.1 μm, the diameter D10 representing the diameter for which 10% of the particles have a diameter below that value. Preferably, the diameter D10 is less than 0.8 μm. the measurements of the granulometry are made with a laser granulometer, for example such as Mastersizer MS2000.

The porosity level of the electrically conductive silver track is determined by microanalysis of the layer of silver paste deposited by screen printing on at least one portion of the substrate. A cross section through the portion of the substrate coated with said electrically conductive track is observed under scanning electron microscope. The image obtained by scanning electron microscopy (SEM) contains zones of a light-grey colour, which correspond to the silver paste, zones of a dark-grey colour, corresponding to the glass frit present in the conductive paste, and black zones, which are indicative of the porosity of the layer. The porosity level of the layer is calculated by determining the percentage of black zones by processing images of a given zone. For example, a length of 50 μm of the cross section of the substrate may be observed, the images being obtained by SEM with a magnification of 5000 and a voltage of 10 kV. The porosity level is given in percent and is a value corresponding to the average of the various values of the porosity levels obtained after observing 10 different positions.

Thus, the method for measuring the porosity level of the electrically conductive track used in the present invention is the following:
1) observing under electron microscope a length of about 50 μm of the cross section polished by ion milling of the portion of the substrate coated with said track;
2) determining by image processing the quantity of observed black zones indicative of the porosity to determine the porosity level expressed in percentage of dark zones with respect to the entirety of the observed area;
3) repeating the steps 1 and 2 with at least ten different zones of the polished cross section to obtain at least ten porosity-level values;
4) calculating the average of the obtained porosity-level values.

It is essential if the propagation of cracks is to be limited for the electrically conductive track to "not be very porous" i.e. for its porosity level to be lower than 20%.

Preferably, the electrically conductive silver-based track has a porosity distribution such that the longest length of 90% of the pores is lower than 6 μm. The size of the pores is measured by scanning electron microscopy, on a cross section of the part of the substrate comprising the electrically conductive stack, after firing and having been polished beforehand by ion milling.

In addition to this condition relating to the porosity level of the layer, it is also necessary for the silver electrically conductive track to have a resistivity lower than or equal to 3.5 μΩ·cm, this resistivity being measured at a temperature of 25° C. The resistivity of less than 3.5 μΩ·cm makes it possible to ensure a good compatibility between the silver conductive paste and the solder alloy made of chromium-based steel. The resistivity p, expressed in ohms·cm, is obtained by measuring the electrical resistance R in ohms of a conductive wire made of silver and by taking into account the length l in m and the cross section of the wire S in m².

$$p = R \cdot \frac{S}{l}$$

The cross section of the wire is for example measured using a contact or contactless profilometry method. The resistivity measurement is generally carried out with a 1 m length of wire.

The conductive silver paste used to screen print the electrically conductive tracks advantageously contains between 90 and 97% by weight silver, the rest being the glass frit. This content of silver corresponds to the content after firing of the electrically conductive paste. The thickness of the electrically conductive silver track measured after firing varies between 2 and 30 μm and preferably between 5 and 15 μm.

The alloy used to solder the electrical connector to the electrically conductive silver track is an alloy based on tin, silver and copper. It is a question of an alloy considered to be "lead-free", meeting the standards specified by the European directive. The alloy used to solder the connector to the glazing according to the present invention is an alloy that comprises from 90 to 99.5% by weight tin, preferably from 93 to 99% by weight tin and even more preferably from 95 to 98% by weight tin. It also comprises, in addition to the tin, 0.5 to 5% by weight silver and 0 to 5% by weight copper. The alloy may also contain bismuth, indium, zinc and/or manganese. Very preferably, the solder alloy is an alloy comprising 96.5% by weight tin, 3% by weight silver and 0.5% by weight copper. The solder alloy is placed on the bottom portions of the electrical connector. The thickness of the layer of solder alloy is preferably smaller than or equal to 600 μm and is even more preferably comprised between 150 and 600 μm.

The electrical connector is made of chromium-containing steel. Very preferably, the electrical connector is made of stainless steel, i.e. made of steel comprising at least 10.5% by weight chromium. This type of connector has the advantage of being compatible with solder alloys based on tin, copper and silver. Specifically, it is necessary for the various materials to have thermal expansion coefficients that allow them to be used conjointly, without running the risk of generating excessively high mechanical stresses that would lead to zones of fragility and the propagation of cracks. The thermal conductivity of connectors made of stainless steels is about 25 to 30 W/mK, which is higher than that of a connector made from a titanium-based alloy for example.

This higher thermal conductivity facilitates the soldering process as it promotes more uniform heating. Stainless steel connectors have the advantage of expanding less than copper-based connectors, for example. Particularly recommended stainless steel alloys are, for example, the steels 1.4016, 1.4113, 1.4509 and 1.4510 according to standard EN 10 088-3. The connector preferably has a thickness comprised between 0.1 and 2 mm, more preferably between 0.2 and 1 mm and even more preferably between 0.3 and 0.8 mm.

The connector optionally possesses a wetting layer or coating based on nickel, copper, zinc, tin, silver, gold or alloys thereof, on the surface that makes contact with the solder alloy. Preferably, this coating is based on nickel and/or silver. The thickness of this coating is preferably between 0.1 µm and 0.3 µm for the nickel and 3 to 20 µm for the silver.

According to one embodiment, the electrical connector possesses on its lower face, i.e. the face intended to be placed on the substrate, at least two dimples or at least one spacer that make it possible to ensure that the connection between the connector and the conductive silver layer is made correctly by way of the solder alloy. These dimples or spacers make the system more robust as they help to contain the alloy and prevent zones containing nonuniform amounts of solder alloy, which could lead to zones of poorer adhesion between the various components, from forming. These dimples or spacer also allow mechanical stresses that could be generated between the connector element and the substrate to be decreased. They advantageously have a circular shape and are especially as described in patent application US 2014/0110166. These dimples or spacers preferably have a width of between $0.5 \times 10^{-4}$ m and $10 \times 10^{-4}$ m and a height of between $0.5 \times 10^{-4}$ m and $5 \times 10^{-4}$ m. The presence of these dimples or of the spacer especially allows the thickness of the solder alloy that is placed under the connector to be controlled. Since strain increases with thickness, it is advantageous to be able to keep the thickness of the alloy as uniform as possible to prevent any clumps that could form a particular weak zone.

The connector may also be equipped with at least one contact bump that makes it easier to solder. This contact bump is located in the zone to be soldered of the connector.

The substrate on which the electrical connection system is placed is preferably made of glass, and more particularly of flat glass that is for example fabricated using the float process, in which molten glass is poured onto a molten metal bath. It may for example be a quartz glass, a borosilicate glass, an aluminosilicate glass and/or a soda-lime glass. The substrate may also be polymeric, and may comprise polyethylene, polypropylene, polycarbonate, polymethyl methacrylate, polystyrene, polybutadiene, polynitriles, polyester, polyurethane, polyvinyl chloride, polyacrylates, polyamide, polyethylene terephthalate and/or copolymers or blends thereof. The substrate is preferably transparent. It has a thickness comprised between 0.5 mm and 25 mm, and preferably between 0.5 and 10 mm.

The substrate may be a tempered glass or a non-tempered glass. In tempered glasses a surface layer is reinforced and therefore stronger, thereby allowing weakening effects engendered by the presence of the electrical connecting system to be observed more easily.

The invention also relates to a process for manufacturing a glazing consisting of at least one substrate possessing an electrically connecting system, said process comprising the following steps:

a) applying a solder alloy based on tin, copper and silver to at least one contact zone of an electrical connector made of a chromium-based steel;

b) placing the electrical connector with the soldering alloy on a silver electrically conductive track deposited on the either coated or uncoated substrate, said track having a resistivity measured at 25° C. lower than or equal to 3.5 µΩ·cm and a porosity level lower than 20%, said porosity level being measured by scanning electron microscopy from a cross section polished by ion milling a portion of the substrate comprising the electrically connecting system; and c) soldering the contact zone of the connector to the electrically conductive silver track.

Preferably, in step a), a small amount of solder alloy, taking the form of a pad or a flattened droplet, is deposited on the contact zone of the connector. The shape, volume and thickness of the deposited alloy are preset. Preferably, the thickness of the deposited solder-alloy pad is smaller than or equal to 0.6 mm. Its shape is preferably identical to the shape of the contact zone, in order to ensure that the latter makes contact with the electrically conductive track over the entirety of its area.

The electrically conductive silver track is obtained by depositing, using methods known to those skilled in the art, for example by screen printing, a conductive silver paste (silver-based enamel) on the substrate. The deposition of the layer of conductive silver paste is carried out independently of step a), insofar as it may be carried out before, during or after step a). The layer of silver paste may be deposited directly on the substrate, or on a layer itself deposited on the substrate. Thus the layer of conductive silver paste may be deposited on a black enamel layer deposited on the substrate and essentially intended to prevent the electrically connecting system from being seen from the exterior of the glazing.

Once deposited, the layer of conductive paste is then dried at about 150° C. then fired under air at a temperature comprised between 550° C. and 700° C. for a length of time of between 2 and 10 minutes (fritting step). The silver-based enamel thus fritted is a solid. The contact terminals or connectors may be soldered in order to allow conductive wires to be supplied with electricity.

The connector may be soldered to the electrically conductive silver track by stamping, piston soldering, microflame soldering, laser soldering, hot-air soldering, induction soldering, resistive soldering and/or ultrasonically.

The present invention also relates to the use of a glazing comprising at least one electrically connecting system such as described above in buildings or vehicles, and in particular automotive vehicles, rail vehicles or aeroplanes. The glazings are especially used as heated windscreens, side windows, rear windscreens or roofs or windscreens, side windows, rear windscreens or roofs equipped with an antenna or with any other electrical function placed on or in the glazing.

The following examples illustrate the invention nonlimitingly.

The temperature cycling test is a test described in standard EN ISO 16750-4-H section 5.3.1.2. The temperatures and durations of the cycles are given in the table below:

| Duration (min) | Temperature (° C.) |
|---|---|
| 0. | +20 |
| 60 | −40 |
| 150 | −40 |
| 210 | 20 |

| Duration (min) | Temperature (° C.) |
|---|---|
| 300 | +105 |
| 420 | −105 |
| 480 | +20 |

During these cycles, the humidity in the measurement chamber was not controlled. The sample underwent at least 60 successive cycles. A voltage of 14 V (+/−0.2) was applied to the sample in the phases in which temperature was increased (standard VW80101).

FIG. 1 is an image observed by scanning electron microscopy of a sample not according to the invention, in which the electrically conductive layer (1) is observed to have a high porosity level (higher than 20%).

Figure 2:
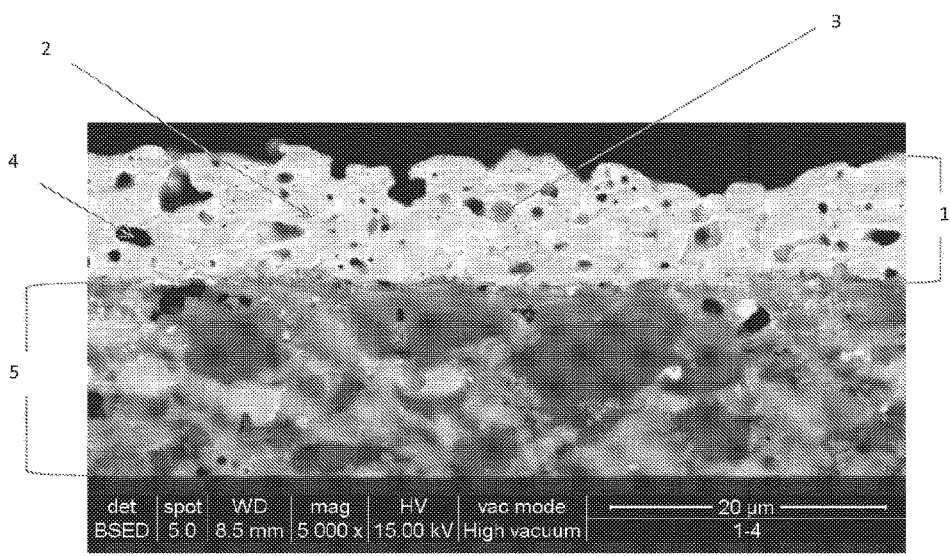
FIGS. 2 and 3 are images observed by scanning electron microscopy of a sample according to the invention, in which the electrically conductive layer (1) is observed to have a low porosity level (lower than 20%).
Figure 3:
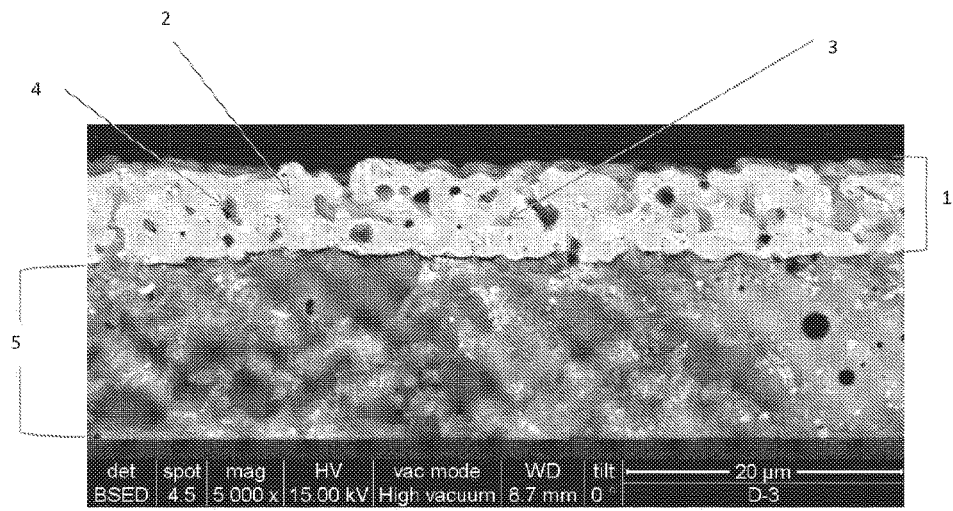

FIGS. 2 and 3 are images observed by scanning electron microscopy of a sample according to the invention, in which the electrically conductive layer (1) is observed to have a low porosity level (lower than 20%).
In these photos, the light-grey zones (2) correspond to the silver electrically conductive layer (1), the darker grey zones (3) to the glass frit and the black zones (4) to the porosity of the silver layer.
In these figures, the electrically conductive layer (1) is deposited on an enamel layer (5).

In the following examples, the granulometry measurements have been made with a laser MAstersizer MS2000 granulometer, operating with a red light source of He-Ne laser type and a blue light source of LED type, after dispersion of the silver paste in acetone. To prepare the samples, 50 mg of silver paste are diluted in 20 mL of acetone.

The measurements of the pore size and specifically the measurement of their longest length, is made from images observed under scanning electron microscopy, after firing of the electrically conductive paste.

Comparative Example 1 (not According to the Invention)

A plurality of samples were manufactured by depositing a layer of conductive silver paste on a zone of a glass substrate, in which zone a layer of black enamel had been deposited beforehand. The silver particles of this paste are essentially in the form of flakes whose size is between 0.5 and 10 µm. The granulometry of the silver particles is such that the average diameter D10 is 1.25 µm. The layer of silver paste and the layer of enamel were deposited by screen printing, with a screen made from a 77.55-mesh fabric woven from polyester threads. The silver paste was dried at 150° C. then fritted under air at a temperature of 640° C. for a time of 140 seconds and then the substrate thus coated was quenched. The sample thus obtained was cut and placed in an ion miller in order to polish its cross section. The polishing was carried out with a Hitachi IM4000 miller under a flow of argon, with a voltage of 6 kV, during a polishing cycle that lasted 2 hours. The sample was then observed in a scanning electron microscope by detecting backscattered electrons, with a magnification of 5000 and a voltage of 10 kV. A zone of 50 µm length was observed. The porosity level was evaluated by measuring the percentage of black zones in the study sample by analysing the obtained image with the software package Image Pro. The electrically conductive track thus obtained had a porosity level measured by scanning electron microscopy of 30%. The longest length of the pores is 8.5 µm.

The resistivity measurement was carried out using a Tailor Hobson Talysurf 50 surface profilometer to determine the cross section of a 1 m length of wire. The resistivity of the electrically conductive track was 4.5 µΩ·cm, at 25° C.

A stainless steel connector (reference number 1.4016) was induction-soldered by way of an Sn96.5Ag3Cu0.5 alloy to the electrically conductive silver track. Prior to this soldering step, the glass substrate was preheated to 60° C. and the surface of the electrically conductive track was brushed with a steel-wool brush.

The glass substrate to which the electrical connector was soldered was then subjected to the temperature cycle described above 60 consecutive times.

After these tests, substantial cracking was observed in all the samples prepared. Such samples therefore do not meet the criteria specified for temperature cycling tests.

Example 2 According to the Invention

Samples were prepared in the same way as described for example 1, with a different conductive silver paste. The enamel used was identical to that of example 1. The silver particles of this paste are essentially in the form of flakes whose size is between 1 and 6 µm and of spherical particles whose size is between 140 and 400 µm. The granulometry of the silver particles is such that the average diameter D10 is 0.46 µm The electrically conductive track obtained from this silver paste had a porosity level of 16% and a resistivity of 3.2 µΩ·cm at 25° C. The longest length of the pores is 3.5 µm.

The solder alloy and the connectors used were also identical to those of example 1. Two types of soldering (induction soldering and resistive soldering) were tested on various samples. The samples were then subjected to temperature cycling tests, under the same conditions as those described in example 1.

All the samples successfully passed the tests without cracks appearing.

Example 3 According to the Invention

Samples were prepared in the same way as described for example 1, with a different conductive silver paste. The enamel used was identical to that of example 1. The silver particles of this paste are essentially in the form of spheres whose size is between 1.2 and 2.4 µm and of smaller particles whose size is between 70 and 400 µm. The granulometry of the silver particles is such that the average diameter D10 is 0.43 µm The electrically conductive track obtained from this silver paste had a porosity level of 15% and a resistivity of 2.8 µΩ·cm at 25° C. The longest length of the pores is 1.8 µm.

The solder alloy and the connectors used were also identical to those of example 1. Two types of soldering (induction soldering and resistive soldering) were tested on various samples. The samples were then subjected to temperature cycling tests, under the same conditions as those described in example 1.

All the samples successfully passed the tests without cracks appearing

Identical samples to those described for example 2 were prepared using a black enamel different to that used in example 2. The other components of the system were all identical to those described in example 2. All the samples thus obtained successfully passed the tests without cracks appearing.

The invention claimed is:

1. A glazing consisting of a substrate at least one portion of which comprises an electrically conductive element, said conductive element comprising an electrical connector made of chromium-containing steel, which electrical connector is soldered with a solder based on tin, silver and copper to an electrically conductive track, wherein the electrically conductive track, which is silver-based, has a resistivity measured at 25° C. lower than or equal to 3.5 μΩ·cm and a porosity level lower than 20%, said porosity level being measured by scanning electron microscopy from a cross section through the portion of the substrate comprising the electrically conductive track and having been polished beforehand by ion milling.

2. The glazing according to claim 1, wherein the electrically conductive track is a fritted silver paste comprising a mixture of silver powder and glass frit.

3. The glazing according to claim 1, wherein the silver-based electrically conductive track has a porosity distribution such that a longest length of 90% of the pores is lower than 6 μm.

4. The glazing according to claim 2, wherein the fritted silver paste comprises some particles with different sizes, among which small particles with a size less than 500 nm are present.

5. The glazing according to claim 4, wherein the small particles have a spherical form whose diameter is less than 500 nm.

6. The glazing according to claim 4, wherein a granulometry of silver particles present in the fritted silver paste is such that an average diameter D10 is less than 1.1 μm, the diameter D10 representing the diameter for which 10% of the particles have a diameter below that value.

7. The glazing according to claim 1, wherein the solder is an alloy comprising from 90 to 99.5% by weight tin.

8. The glazing according to claim 7, wherein the solder also comprises, in addition to the tin, 0.5 to 5% by weight silver and 0 to 5% by weight copper.

9. The glazing according to claim 1, wherein the solder is an alloy comprising 96.5% by weight tin, 3% by weight silver and 0.5% by weight copper.

10. The glazing according to claim 1, wherein the electrical connector is made of stainless steel.

11. The glazing according to claim 1, wherein the electrical connector possesses on its lower face, which is intended to be placed on the substrate, at least two dimples or a spacer.

12. The glazing according to claim 1, wherein a thickness of the silver electrically conductive track measured after fritting varies between 2 and 30 μm.

13. The glazing according to claim 1, wherein the substrate is a tempered glass.

14. The glazing according to claim 1, wherein the substrate is a non tempered glass.

15. A process for manufacturing a glazing consisting of at least one substrate possessing an electrically connecting system, said process comprising:
    applying a solder alloy based on tin, copper and silver to at least one contact zone of an electrical connector made of a chromium-based steel;
    placing the electrical connector equipped with the soldering alloy on a electrically conductive silver track deposited on the either coated or uncoated substrate, said track having a resistivity measured at 25° C. lower than or equal to 3.5 μΩ·cm and a porosity level lower than 20%, said porosity level being measured by scanning electron microscopy from a cross section through a portion of the substrate comprising the electrically conductive track, which is polished beforehand by ion milling; and
    soldering the contact zone of the connector to the electrically conductive silver track.

16. The process according to claim 15, wherein, in said applying, a pad or flattened droplet of a thickness smaller than or equal to 0.6 mm is deposited on the contact zone of the connector.

17. The process according to claim 15, wherein the connector is soldered to the electrically conductive silver track by stamping, piston soldering, micro-flame soldering, laser soldering, hot-air soldering, induction soldering, resistive soldering, with a soldering iron and/or ultrasonically.

18. A method comprising utilizing a glazing according to claim 1 in buildings or automotive vehicles, rail vehicles or aeroplanes.

19. The method according to claim 18, wherein the glazing forms a heated windscreen, a side window, a rear windscreen or a roof or a windscreen, a side window, a rear windscreen or a roof equipped with an antenna or with any other electrical function placed on or in the glazing.

20. The glazing according to claim 7, wherein the alloy comprises from 95 to 98% by weight tin.

* * * * *